United States Patent
Umezawa (10) Patent No.: US 8,094,496 B2
(45) Date of Patent: Jan. 10, 2012

(54) NONVOLATILE SEMICONDUCTOR MEMORY DEVICE AND CONTROL METHOD THEREOF

(75) Inventor: Akira Umezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 240 days.

(21) Appl. No.: 12/475,799

(22) Filed: Jun. 1, 2009

(65) Prior Publication Data

US 2010/0008143 A1     Jan. 14, 2010

(30) Foreign Application Priority Data

Jul. 14, 2008   (JP) ................................. 2008-183147

(51) Int. Cl.
| | | |
|---|---|---|
| G11C 16/04 | (2006.01) | |
| G11C 16/02 | (2006.01) | |
| G11C 5/02 | (2006.01) | |
| G11C 5/06 | (2006.01) | |
| G11C 16/00 | (2006.01) | |
| H01L 29/792 | (2006.01) | |

(52) U.S. Cl. ................. 365/185.05; 365/185.16; 365/51; 365/63; 365/72; 257/324; 257/E21.423; 257/E29.309

(58) Field of Classification Search ............. 365/185.05, 365/185.16, 51, 63, 72; 257/324, E21.423, 257/E29.309
See application file for complete search history.

(56) References Cited

U.S. PATENT DOCUMENTS

| | | | | |
|---|---|---|---|---|
| 5,005,060 A | * | 4/1991 | Mazzali | .................... 365/185.16 |
| 5,016,216 A | * | 5/1991 | Ali | ............................ 365/185.05 |
| 5,278,785 A | * | 1/1994 | Hazani | ...................... 365/185.16 |
| 6,963,108 B1 | * | 11/2005 | Kang et al. | ..................... 257/330 |
| 2006/0192266 A1 | * | 8/2006 | Willer et al. | ................... 257/510 |
| 2007/0007586 A1 | * | 1/2007 | Tempel | .......................... 257/330 |
| 2007/0020857 A1 | * | 1/2007 | Chindalore et al. | ........... 438/270 |
| 2007/0145460 A1 | * | 6/2007 | Lee | ................................ 257/314 |

FOREIGN PATENT DOCUMENTS

JP     2-210869     8/1990

(Continued)

OTHER PUBLICATIONS

Anirban Roy, et al., "A New Flash Architecture with a.5.8$\lambda^2$ Scalable AMG Flash Cell", 1997 Symposium on VLSI Technology Digest of Technical Papers, pp. 67-68.

(Continued)

*Primary Examiner* — J. H. Hur
(74) *Attorney, Agent, or Firm* — Oblon, Spivak, McClelland, Maier & Neustadt, L.L.P.

(57) ABSTRACT

A nonvolatile semiconductor memory device includes a multi-layer insulating film having at least charge storage layers and formed on bottom surfaces and both side surfaces of a plurality of trench portions respectively formed in portions between the plurality of active areas formed in a first direction, a plurality of gate electrodes filled in internal portions of the plurality of trench portions with the multi-layer insulating film, a plurality of first metal interconnections formed in a second direction and each functioning as a bit line or source line, and a plurality of first conductivity-type diffusion layer regions arranged in a staggered form in corresponding portions of the plurality of active areas which intersect with the plurality of first metal interconnections. The device further includes a plurality of connection contacts form to respectively connect the plurality of first conductivity-type diffusion layer regions to the plurality of first metal interconnections.

23 Claims, 6 Drawing Sheets

FOREIGN PATENT DOCUMENTS

JP          7-58299          3/1995

OTHER PUBLICATIONS

Eduardo Maayan, et al., "A 512Mb NROM Flash Data Storage Memory with 8MB/s Data Rate", International Solid-State Circuits Conference 2002 / Session 6 / SRAM and Non-Volatile Memories / 6.1, Feb. 4, 2002, 2 pages.

S. All, et al., "A new Staggered Virtual Ground array architecture Implemented in a 4Mb CMOS EPROM", VLSI Circuits, 1989, Digest of Technical Papers, pp. 35-36.

A. Bergemont, et al., "NOR Virtual Ground (NVG)—A New Scaling Concept for Very High Density FLASH EEPROM and its Implementation in a 0.5um Process", IEDM 93, pp. 15-18.

* cited by examiner

NONVOLATILE SEMICONDUCTOR MEMORY DEVICE AND CONTROL METHOD THEREOF

CROSS-REFERENCE TO RELATED APPLICATIONS

This application is based upon and claims the benefit of priority from prior Japanese Patent Application No. 2008-183147, filed Jul. 14, 2008, the entire contents of which are incorporated herein by reference.

BACKGROUND OF THE INVENTION

1. Field of the Invention

This invention relates to a nonvolatile semiconductor memory device and a control method thereof, and more particularly to a NOR flash memory with a metal oxide nitride oxide semiconductor (MONOS) structure.

2. Description of the Related Art

Recently, in a NOR flash memory, it becomes more difficult to shrink the gate length as the generation proceeds. This is because it is necessary to apply a drain voltage (write voltage) of 3 eV or more in order for carriers to jump over an energy barrier of a silicon oxide film (tunnel oxide film) lying between a charge storage layer and a channel in a NOR flash memory of a channel hot electron (CHE) injection system. However, as the gate length of a memory cell (the gate electrode of a cell transistor) is shrunk, the punch-through withstand voltage between the drain and the source is lowered. If the punch-through withstand voltage becomes lower than the write voltage required for writing, an erroneous write phenomenon occurs.

The erroneous write phenomenon is a phenomenon in which the threshold voltage of a non-selected cell varies at the write time. That is, if the gate length is excessively reduced, the withstand voltage cannot be maintained and a leak current occurs when a write voltage of 3V, which is the same as that applied to a selected cell or more, is applied to the drain terminal of a non-selected cell commonly connected to a write bit line. Then, electrons or holes caused by an unintentional channel current that flows through the drain-source path act on the gate electrode and change the threshold voltage of the non-selected cell.

As the flash memory of the CHE injection system, an alternate conversion virtual ground (alternate metal virtual ground: AMG) flash memory is already known (for example, see 1997 Symposium On VLSI Technology Digest of Technical Papers pp. 67-68 "A NEW FLASH ARCHITECTURE WITH A 5.8$\lambda^2$ SCALABLE AMG FLASH CELL", Anirban R., et al). The AMG flash memory is a flash memory of a CHE injection system having floating gates, but it can be replaced by a trap flash memory with a MONOS structure having no floating gates.

However, in the trap flash memory with the MONOS structure, the following problem occurs. That is, since a plane structure in which the gate electrodes are formed above the silicon substrate is provided, the rate of shrink of memory cells is controlled according to the gate lengths thereof when the punch-through withstand voltage between the drain and the source is lowered.

BRIEF SUMMARY OF THE INVENTION

According to a first aspect of the present invention, there is provided a nonvolatile semiconductor memory device comprising a semiconductor substrate having a plurality of active areas formed to extend in a first direction and separated from one another with a plurality of trench portions disposed therebetween; a multi-layer insulating film having at least charge storage layers and formed on bottom surfaces and both side surfaces of the plurality of trench portions; a plurality of gate electrodes filled in internal portions of the plurality of trench portions with the multi-layer insulating film disposed therebetween; a plurality of first metal interconnections formed to extend in a second direction perpendicular to the first direction, arranged on a surface of the semiconductor substrate with inter-level insulating films disposed therebetween and each functioning as one of bit lines and source lines; a plurality of first conductivity-type diffusion layer regions arranged in a staggered form in corresponding portions of the plurality of active areas which are formed to intersect with the plurality of first metal interconnections and each functioning as one of sources and drains; a plurality of second conductivity-type diffusion layer regions having an opposite conductivity type to that of the plurality of first conductivity-type diffusion layer regions and formed in the plurality of active areas to electrically isolate the plurality of first conductivity-type diffusion layer regions from one another; and a plurality of connection contacts arranged in a staggered form to respectively connect the plurality of first conductivity-type diffusion layer regions to the plurality of first metal interconnections.

According to a second aspect of the present invention, there is provided a nonvolatile semiconductor memory device comprising a semiconductor substrate having a plurality of active areas formed to extend in a first direction; a multi-layer insulating film having at least charge storage layers and formed on bottom surfaces and both side surfaces of the plurality of trench portions corresponding to portions respectively lying between the plurality of active areas on a surface portion of the semiconductor substrate; a plurality of gate electrodes filled in internal portions of the plurality of trench portions with the multi-layer insulating film disposed therebetween; a plurality of first metal interconnections formed to extend in a second direction perpendicular to the first direction, arranged on a surface of the semiconductor substrate with inter-level insulating films disposed therebetween and each functioning as one of bit lines and source lines; a plurality of first conductivity-type diffusion layer regions arranged in a staggered form in corresponding portions of the plurality of active areas which intersect with the plurality of first metal interconnections and each functioning as one of sources and drains; and a plurality of connection contacts arranged in a staggered form to respectively connect the plurality of first conductivity-type diffusion layer regions to the plurality of first metal interconnections.

According to a third aspect of the present invention, there is provided a control method of the nonvolatile semiconductor memory device described in the first aspect comprising applying a first voltage to a first gate electrode among the plurality of gate electrodes which are connected to a selected cell to be written, applying a ground voltage to a second gate electrode that is adjacent to the first gate electrode and connected to a non-selected cell that is not to be written, applying a second voltage to one first metal interconnection functioning as a bit line among the plurality of first metal interconnections which are connected to one of the plurality of first conductivity-type diffusion layer regions functioning as a drain of the selected cell, and applying a ground voltage to another first metal interconnection functioning as a source line among the plurality of first metal interconnections which are connected to one of the plurality of first conductivity-type diffusion layer regions functioning as a source of the selected cell.

DETAILED DESCRIPTION OF THE INVENTION

Embodiments of the present invention will be described with reference to the accompanying drawings. It should be noted that the drawings are schematic ones and so are not to scale. The following embodiments are directed to a device and a method for embodying the technical concept of the present invention, and the technical concept does not specify the material, shape, structure or configuration of components of the present invention. Various changes and modifications can be made to the technical concept without departing from the scope of the claimed invention.

First Embodiment

Figure 1:
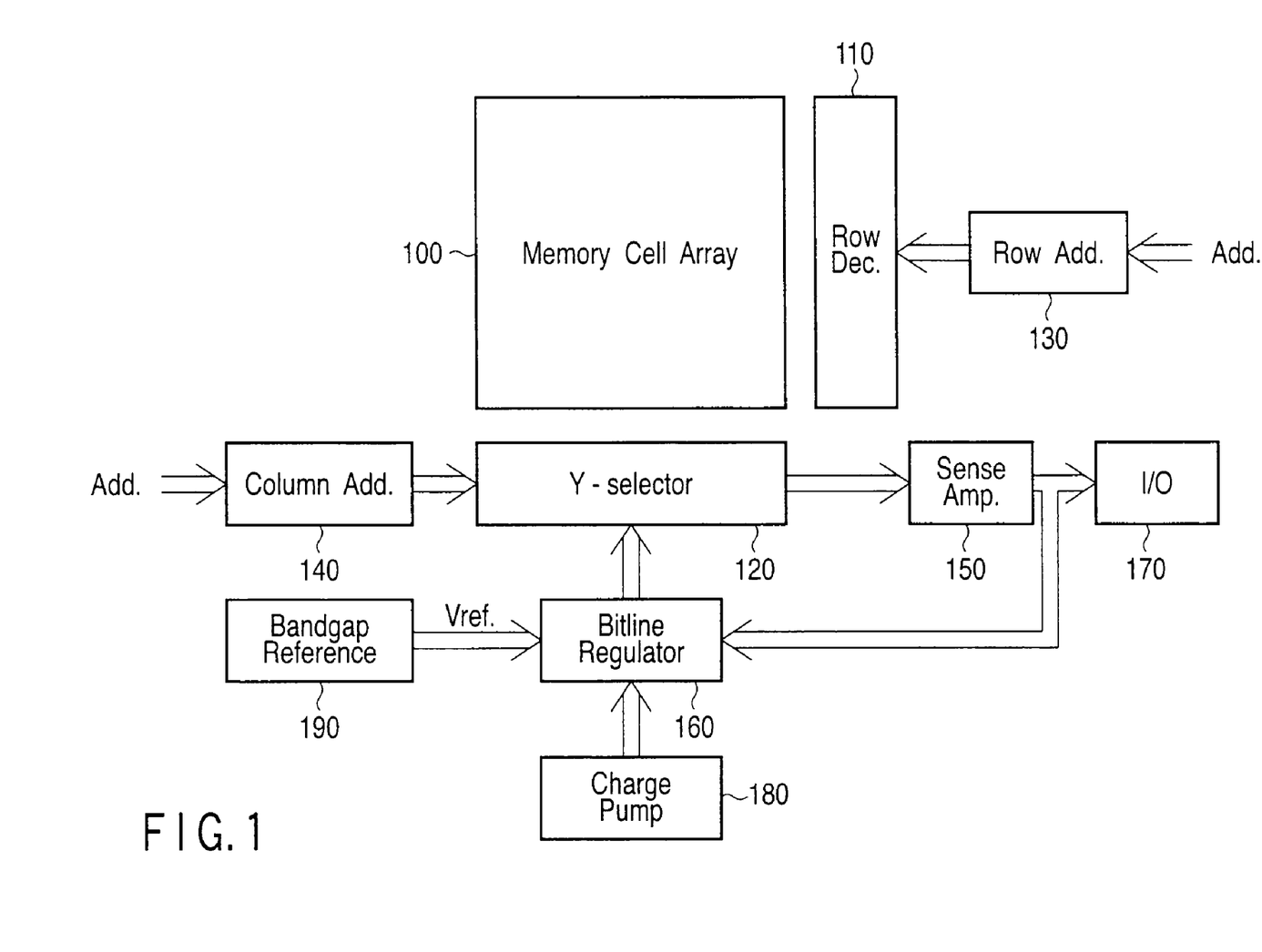
FIG. 1 is a block diagram showing an example of the configuration of a nonvolatile semiconductor memory device (NOR flash memory with a MONOS structure) according to a first embodiment of this invention.

FIG. 1 shows an example of the configuration of a nonvolatile semiconductor memory device according to a first embodiment of this invention. In this embodiment, a case wherein a NOR flash memory with a MONOS structure utilizing a channel hot electron write system is taken as an example is explained.

In FIG. 1, a memory cell array 100 is configured by arranging a plurality of flash memory cells (MONOS transistors with a trench gate structure), which are nonvolatile memory cells in which data can be electrically rewritten, in a matrix form. Further, a row decoder (Row Dec.) 110 and data rewrite and read circuit (Y-selector) 120 are provided near the memory cell array 100.

The row decoder 110 selectively applies voltages required for erase, write and read operations to word lines (gate electrodes GC). The data rewrite and read circuit 120 is used to perform data write and read operations and is configured by a column decoder that controls bit lines (source lines).

A row address decoder (Row Add.) 130 is connected to the row decoder 110. The row address decoder 130 decodes an input address signal (Add.) and supplies the decoded signal to the row decoder 110.

A column address decoder (Column Add.) 140, sense amplifier circuit (Sense Amp.) 150 and bit line potential regulating circuit (Bitline Regulator) 160 that functions as a write load circuit are connected to the data rewrite and read circuit 120. The column address decoder 140 decodes an input address signal (Add.) and supplies the decoded signal to the data rewrite and read circuit 120.

The sense amplifier circuit 150 senses data (cell current) read by the data rewrite and read circuit 120. The bit line potential regulating circuit 160 and input/output circuit (I/O) 170 are connected to the sense amplifier circuit 150. The input/output circuit 170 is used to input and output read data supplied from the sense amplifier circuit 150 and write data from the exterior.

The bit line potential regulating circuit 160 generates a potential (write voltage/non-write voltage) applied to a corresponding bit line according to write data supplied from the input/output circuit 170. A charge pump circuit 180 and bandgap reference circuit 190 are connected to the bit line potential regulating circuit 160. The charge pump circuit 180 supplies a raised internal voltage (or lowered internal voltage) to the bit line potential regulating circuit 160. The bandgap reference circuit 190 generates reference potential (Vref.) used as a reference at the time of generation of write voltage/non-write voltage.

Figure 2:
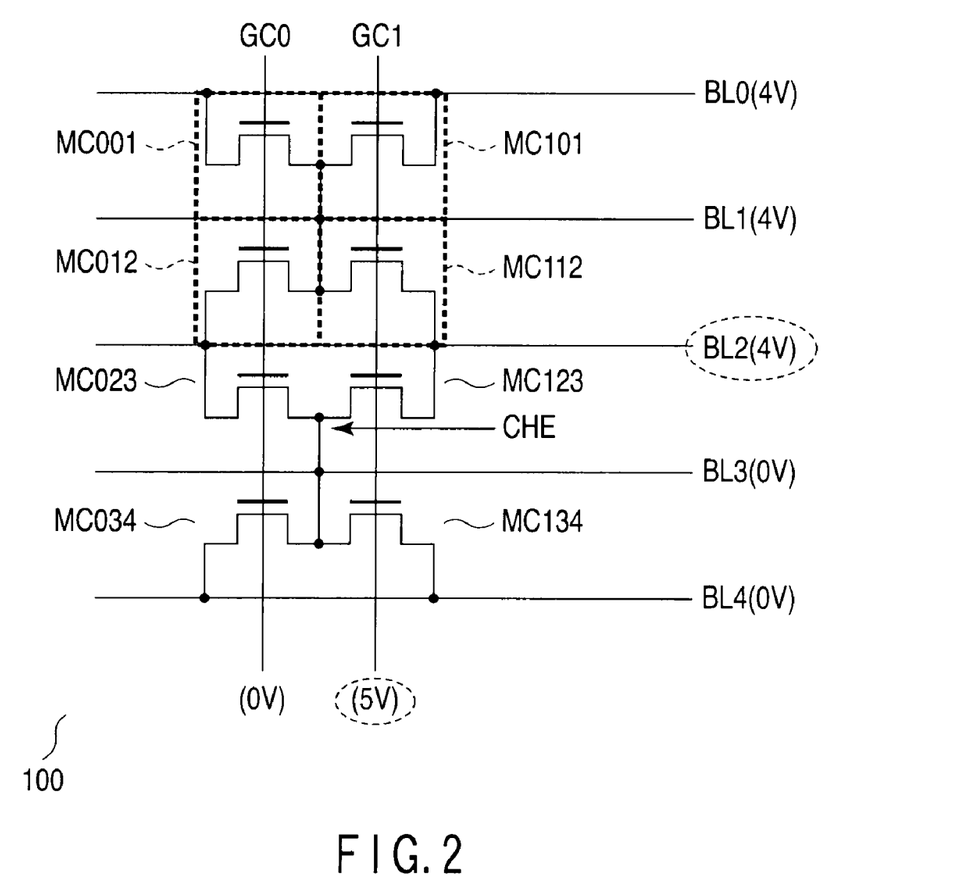
FIG. 2 is a circuit diagram showing an example of the configuration of a memory cell array in the NOR flash memory.

FIG. 2 shows a basic circuit configuration of the memory cell array 100. In this example, eight flash memory cells MC (MC001, MC101, MC012, MC112, MC023, MC123, MC034, MC134) are extracted and shown.

For example, as shown in FIG. 2, the memory cell array 100 has five bit lines (source lines) BL0 to BL4 and two word lines (gate electrodes) GC0, GC1. The word lines GC0, GC1 are arranged in a first direction and the bit lines BL0 to BL4 are arranged in a second direction intersecting with the first direction in which the word lines GC0, GC1 are arranged. The memory cells MC001, MC101, MC012, MC112, MC023, MC123, MC034, MC134 are arranged between the respective bit lines BL0 to BL4 corresponding to the portions thereof intersecting with the word lines GC0, GC1.

That is, the memory cell MC001 is arranged between the bit lines BL0 and BL1 that intersect with the word line GC0, the memory cell MC101 is arranged between the bit lines BL0 and BL1 that intersect with the word line GC1 and the memory cells MC001, MC101 are each formed in contact with the bit lines BL0, BL1. Further, the memory cell MC012 is arranged between the bit lines BL1 and BL2 that intersect with the word line GC0, the memory cell MC112 is arranged between the bit lines BL1 and BL2 that intersect with the word line GC1 and the memory cells MC012, MC112 are each formed in contact with the bit lines BL1, BL2. In addition, the memory cell MC023 is arranged between the bit lines BL2 and BL3 that intersect with the word line GC0, the memory cell MC123 is arranged between the bit lines BL2 and BL3 that intersect with the word line GC1 and the memory cells MC023, MC123 are each formed in contact with the bit lines BL2, BL3. Further, the memory cell MC034 is arranged between the bit lines BL3 and BL4 that intersect with the word line GC0, the memory cell MC134 is arranged between the bit lines BL3 and BL4 that intersect with the word line GC1 and the memory cells MC034, MC134 are each formed in contact with the bit lines BL3, BL4.

Now, the write operation based on a CHE injection system is explained by taking a case wherein the memory cell MC123 is used as a selected cell as an example. For example, as shown in FIG. 2, when data is written into the memory cell MC123, 5V (Vg) is applied to the word line GC1 that is connected to the memory cell MC123 and acts as a selected word line and 0V is applied to the word line GC0 acting as a non-selected word line.

On the other hand, for example, 4V is applied to the bit line BL2 that is connected to the memory cell MC123 and acts as a selected bit line and 0V (VSS) is applied to the bit lines BL3, BL4 acting as non-selected bit lines. In the case of this example, the bit line BL3 functions as a source line. Further, in order to avoid occurrence of a disturb (erroneous writing), 4V, which is the same voltage as that applied to the selected bit line BL2 is applied to the bit line BL0 connected to the non-selected cells MC001, MC101 and the bit line BL1 connected to the non-selected cells MC012, MC112.

As a result, a channel current (CHE) flows from the drain terminal side of the selected cell MC123 to the source terminal side. Then, electrons (or holes) are caused and generated by the channel current. The electrons (or holes) act on the gate electrode GC of the selected cell MC123 and change the threshold voltage of the selected cell MC123. That is, by injecting the channel current into the drain terminal side, electrons (or holes) are trapped in a charge storage nitride film and this causes the threshold voltage of the selected cell MC123 to be raised (or lowered) to write data.

Thus, the operation of writing data into a memory cell in which the bit lines and source lines are alternately electrically switched is performed based on the same system as that of the conventional NOR flash memory (see, for example, Jpn. Pat. Appln. KOKAI Publication No. 02-210869 or Jpn. Pat. Appln. KOKAI Publication No. 07-58299), that is, the CHE system. In this case, the erase operation is performed by injecting hot holes into the nitride film.

Figure 3A:
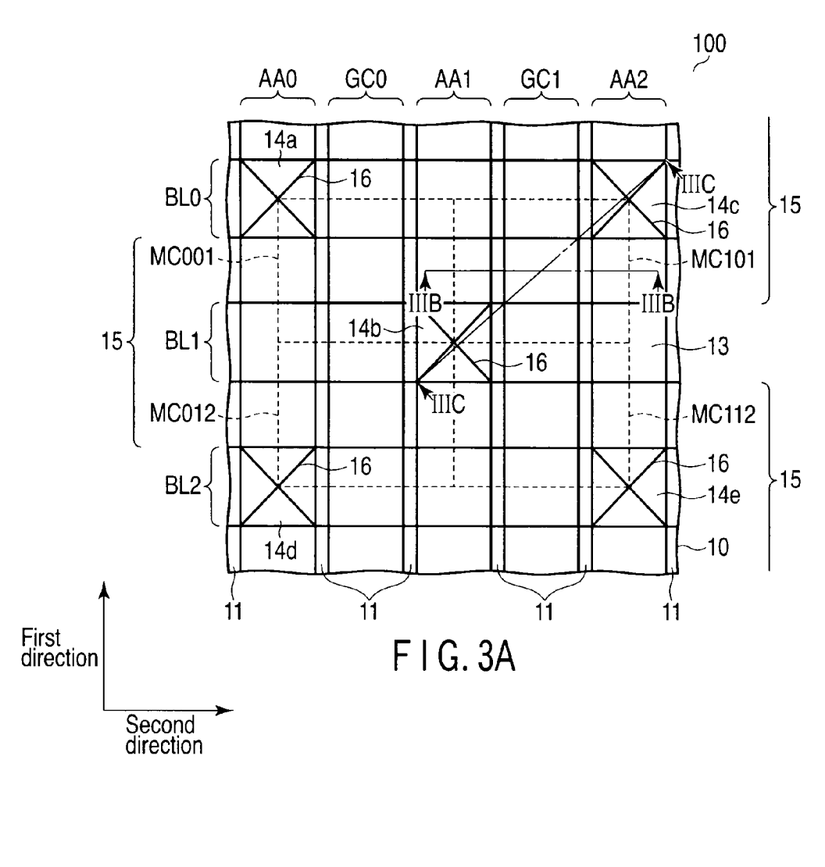
FIGS. 3A to 3C are structural views showing one example of the memory cell array.
Figure 3B:
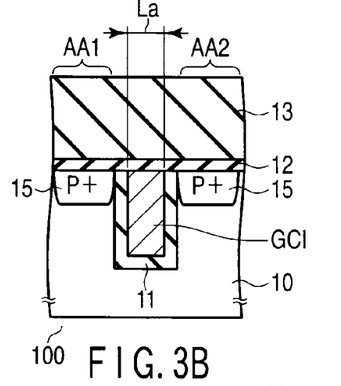
Figure 3C:
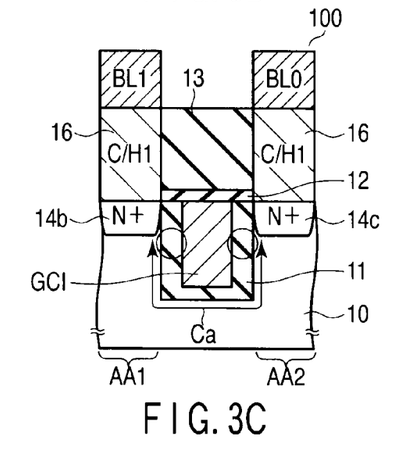

FIGS. 3A to 3C show an example of the structure of the memory cell array 100. In this example, four memory cells MC001, MC101, MC012, MC112 that correspond to portions indicated by broken lines in FIG. 2 are extracted and shown. FIG. 3A is a plan view obtained by seeing through the internal portion of the memory cell array, FIG. 3B is a cross-sectional view taken along the IIIB-IIIB line of FIG. 3A and FIG. 3C is a cross-sectional view taken along the IIIC-IIIC line of FIG. 3A.

As shown in FIGS. 3A to 3C, a plurality of (in this example, three) active areas AA0, AA1, AA2 are formed on the surface portion of a semiconductor substrate (for example, p-type silicon substrate or p-well) 10. The active areas AA0, AA1, AA2 are formed to extend in a first direction and arranged at preset intervals. Word lines (gate electrodes with the trench gate structure) GC0, GC1 are formed between the respective active areas AA0, AA1, AA2 with gate insulating films 11 disposed therebetween. For example, the word lines GC0, GC1 are formed of polysilicon and filled in the surface portions of the semiconductor substrate 10 with the upper surfaces thereof set at substantially the same height as the upper surface of the semiconductor substrate 10. The gate insulating films 11 are formed in correspondence with the bottom surfaces and side surfaces of the word lines GC0, GC1. As the gate insulating film 11, for example, an ONO film (multi-layer insulating film) with a three-layer structure formed of an oxide film (O)/charge storage nitride film (N)/oxide film (O) is used.

Further, bit lines (source lines) BL0, BL1, BL2 arranged in a second direction are provided on the surface of the semiconductor substrate 10 with sacrifice oxide films 12 and inter-level films 13 disposed therebetween. The bit lines BL0, BL1, BL2 are formed of first metal interconnections (M1 layer) of low resistance of aluminum (Al) or copper (Cu) formed of the same layer. As a result, a reduction in the cell current is suppressed and a high-speed read operation can be performed in comparison with a case wherein bit lines are formed by filling N+ diffusion layers, for example. Particularly, a lowering in the write speed due to a voltage drop in the drain can be prevented in the write operation based on the CHE injection system.

N+ diffusion layers (first conductivity-type diffusion layer regions) 14 (14a, 14b, 14c, 14d, 14e) used as drains or sources are provided in a staggered form in intersecting portions between the bit lines BL0, BL1, BL2 and the active areas AA0, AA1, AA2. P+ diffusion layers (second conductivity-type diffusion layer regions) 15 used as P+ isolation areas for electrical isolation are formed in the other portions of the active areas AA0, AA1, AA2. More specifically, N+ diffusion layers 14a, 14d are respectively formed in the intersecting portions of the active area AA0 with the bit lines BL0, BL2 among the intersecting portions between the active areas AA0, AA1, AA2 and the bit lines BL0, BL1, BL2. An N+ diffusion layer 14b is formed in the intersecting portion of the active area AA1 with the bit line BL1. Further, N+ diffusion layers 14c, 14e are respectively formed in the intersecting portions of the active area AA2 with the bit lines BL0, BL2. The N+ diffusion layer 14a is used as the drain or source of the memory cell MC001. The N+ diffusion layer 14c is used as the drain or source of the memory cell MC101. The N+ diffusion layer 14d is used as the drain or source of the memory cell MC012. The N+ diffusion layer 14e is used as the drain or source of the memory cell MC112. The N+ diffusion layer 14b is used as the sources or drains of the memory cells MC001, MC101, MC012, MC112. That is, in the case of this example, the N+ diffusion layer 14b formed in the intersecting portion of the active area AA1 with the bit line BL1 is commonly used by the memory cells MC001, MC101, MC012, MC112.

The N+ diffusion layer 14a used as the drain or source of the memory cell MC001 is connected to the bit line BL0 via a contact (C/H1) 16 and the N+ diffusion layer 14b used as the source or drain thereof is connected to the bit line BL1 via a contact (C/H1) 16. Further, the N+ diffusion layer 14c used as the drain or source of the memory cell MC101 is connected to the bit line BL0 via a contact (C/H1) 16 and the N+ diffusion layer 14b used as the source or drain thereof is connected to the bit line BL1 via the contact 16. Also, the N+ diffusion layer 14d used as the drain or source of the memory cell MC012 is connected to the bit line BL2 via a contact (C/H1) 16 and the N+ diffusion layer 14b used as the source or drain thereof is connected to the bit line BL1 via the contact 16. Further, the N+ diffusion layer 14e is used as the drain or source of the memory cell MC112 is connected to the bit line BL2 via a contact (C/H1) 16 and the N+ diffusion layer 14b used as the source or drain thereof is connected to the bit line BL1 via the contact (C/H1) 16.

Thus, the memory cell array 100 of this embodiment has the N+ diffusion layers 14 (14a to 14e) and contacts 16 arranged in a staggered form. As a result, channel currents of the memory cells MC001, MC101, MC012, MC112 will flow in oblique directions (in directions of the respective opposed contacts) with respect to the word lines GC0, GC1. In the case of the memory cell MC101, for example, as shown in FIG. 3C, most electrons are trapped in portions of the gate insulating film 11 which lie near the N+ diffusion layers 14b, 14c (indicated by marks o in FIG. 3C).

Further, in the case of this embodiment, it is possible to attain an actual gate length (channel length) Ca that is sufficiently large in comparison with the apparent gate length La according to the depth of the gate electrodes (GC0, GC1) by forming the memory cells MC001, MC101, MC012, MC112 by use of MONOS transistors with the trench gate structure. That is, a problem that the rate of shrink of the memory cells MC001, MC101, MC012, MC112 is controlled according to the gate length La can be avoided.

FIGS. 4A to 4E show a manufacturing method of the memory cell array 100. In this example, a manufacturing method of the memory cells (MONOS transistors with the trench gate structure) MC is explained.

Figure 4A:
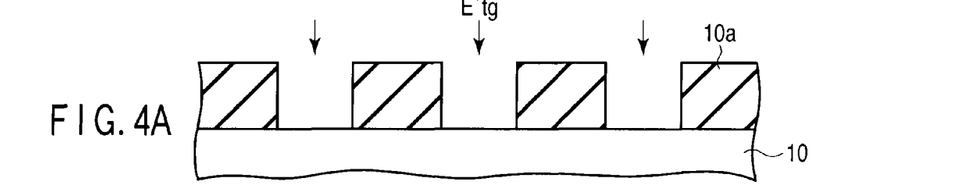
FIGS. 4A to 4E are cross-sectional views for illustrating a manufacturing method of the memory cell array.
Figure 4B:
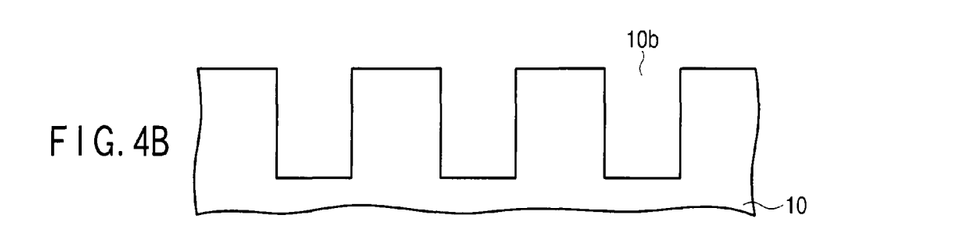

First, for example, as shown in FIG. 4A, a resist film 10a is patterned on the surface of a semiconductor substrate 10 and the surface portion of the semiconductor substrate 10 is etched with the resist film 10a used as a mask (E'tg). As a result, for example, as shown in FIG. 4B, a plurality of trench portions 10b into which gate electrodes (GC0, GC1, GC2) are filled are formed to extend in a first direction with preset intervals in a second direction in the surface portion of the semiconductor substrate 10.

Figure 4C:
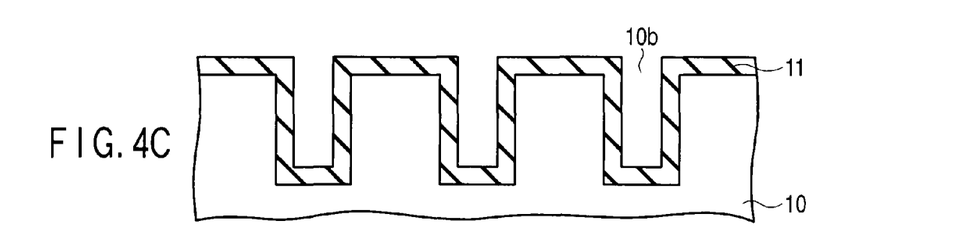

Next, for example, as shown in FIG. 4C, a gate insulating film 11 is deposited to cover the surface of the semiconductor substrate 10 after the resist film 10a is removed.

Figure 4D:
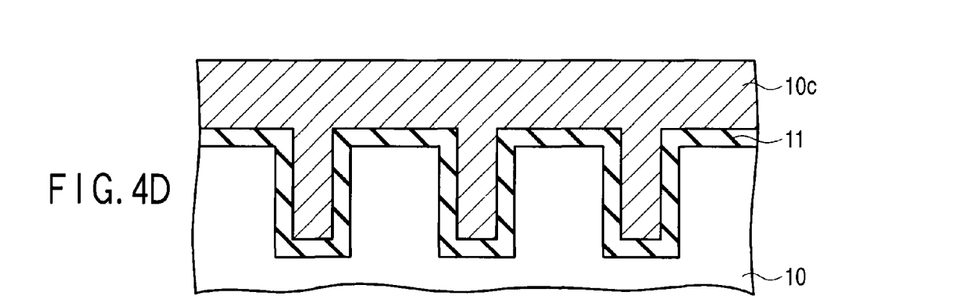

Then, for example, as shown in FIG. 4D, polysilicon 10c is deposited on the gate insulating film 11 to completely fill the trench portions 10b.

Figure 4E:
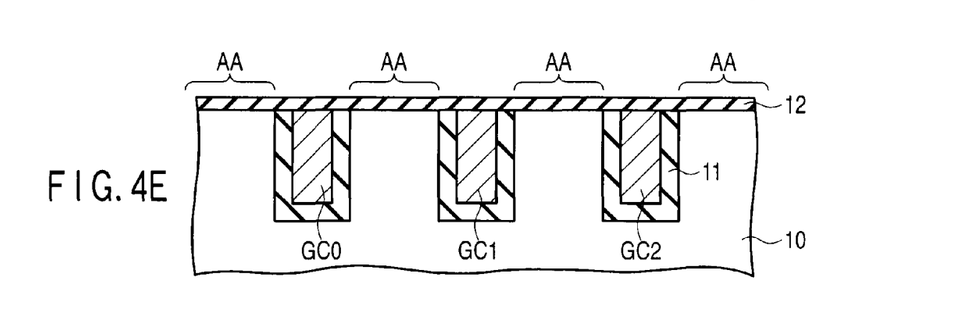

Subsequently, for example, as shown in FIG. 4E, the upper surface of the semiconductor substrate 10 is made flat by use of a CMP method to leave behind the gate insulating film 11 and polysilicon film 10c only in the trench portions 10b. As a result, gate electrodes GC0, GC1, GC2 of the embedded structure are formed.

Then, after a sacrifice oxide film 12 is formed on the upper surface of the semiconductor substrate 10 that is made flat, N+ diffusion layers 14 or P+ diffusion layers 15 are formed in the active areas AA extending along the gate electrodes GC0, GC1, GC2. Thus, MONOS transistors of the trench gate structure used as the memory cells MC are completed.

As described above, a channel current is caused to flow in an oblique direction in the memory cell formed of the MONOS transistor of the trench gate structure. That is, each of the memory cells is formed of the MONOS transistor of the trench gate structure and the N+ diffusion layers used as the drains or sources of the respective memory cells are arranged in a staggered form. As a result, a sufficiently large effective channel length (physical distance between the drain and source) can be attained according to the trench depth of the gate electrode, irrespective of the gate length of the cell. Therefore, the memory cell can be made smaller and the cost can be further reduced even in the case of a NOR flash memory in which the write operation is performed based on the CHE injection system.

Particularly, since the channel current flows in an oblique direction of the cell, a mechanically stronger structure can be attained with respect to scaling of the gate length in comparison with a memory cell in which a channel current simply flows in a direction perpendicular to a gate electrode.

Further, the height of the cells can be suppressed by forming the structure having the gate electrodes embedded therein. Thus, the depth of contact holes used for connection with the bit lines (source lines) can be made shallow and the parasitic resistance can be reduced accordingly. As a result, the read and write performances can be enhanced, the number of cells connected to the bit lines can be greatly increased and the capacity of the memory can be increased.

Further, since the gate electrode GC is formed by filling polysilicon into the trench portion, the gate electrode can be formed in self-alignment with the active area AA. That is, since no exclusive mask is required for formation of the gate electrodes, an advantage that the cell forming process can be simplified in comparison with a process of forming cells of a type in which the floating gates are formed by use of an exclusive mask can be attained.

Second Embodiment

Figure 5A:
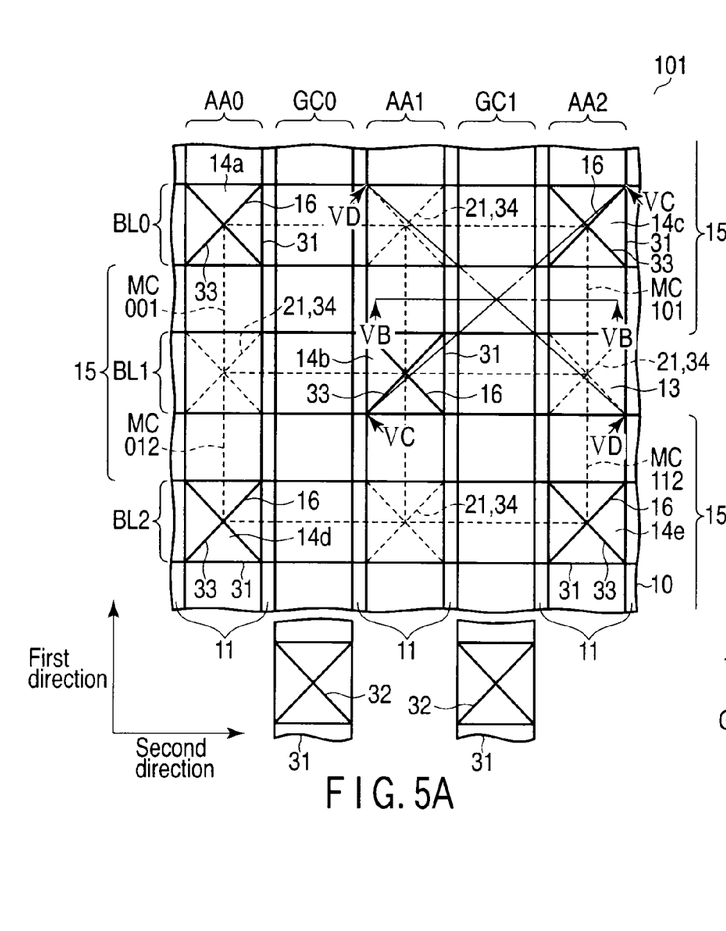
FIGS. 5A to 5D are structural views showing one example of a memory cell array in a NOR flash memory of a MONOS structure according to a second embodiment of this invention.
Figure 5B:
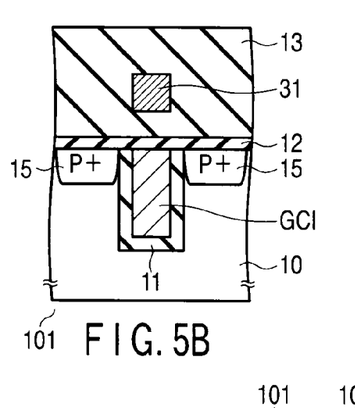
Figure 5C:
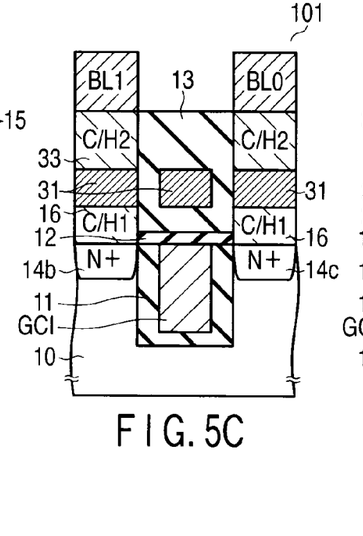
Figure 5D:
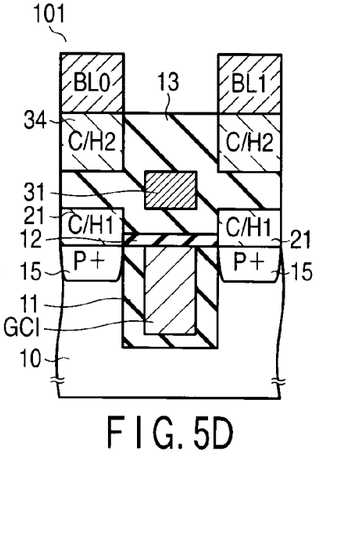

FIGS. 5A to 5D show an example of the structure of a memory cell array 101 in a NOR flash memory of a MONOS structure (nonvolatile semiconductor memory device) according to a second embodiment of this invention. In this example, four memory cells, MC001, MC101, MC012, MC112, which correspond to the portions indicated by the broken lines in FIG. 2, are extracted and shown. FIG. 5A is a plan view obtained by seeing through the internal portion of the memory cell array, FIG. 5B is a cross-sectional view taken along the VB-VB line of FIG. 5A, FIG. 5C is a cross-sectional view taken along the VC-VC line of FIG. 5A and FIG. 5D is a cross-sectional view taken along the VD-VD line of FIG. 5A. Portions that are the same as those of the first embodiment (FIGS. 3A to 3C) are denoted by the same reference symbols and the detailed explanation thereof is omitted.

This embodiment is an example in which redundant contacts (dummy contacts) are formed in non-forming positions of contacts (first contact layer) 16. That is, in the case of the memory cell array 101, for example, as shown in FIGS. 5A to 5D, dummy contacts (first contact layer) 21 are provided in intersecting portions between bit lines BL0, BL1, BL2 and active areas AA0, AA1, AA2 except the contacts 16 arranged in a staggered form. For example, the dummy contacts 21 are arranged in the intersecting portion between the active area AA1 and the bit line BL0, the intersecting portion between the active area AA0 and the bit line BL1, the intersecting portion between the active area AA2 and the bit line BL1 and the intersecting portion between the active area AA1 and the bit line BL2.

By thus forming the dummy contacts 21, an exposure margin in the lithography process can be enhanced (a lithography margin can be stably attained) in comparison with a case wherein only the contacts 16 are arranged in a staggered form. As a result, the contacts 16 can be more easily processed.

Further, in the case of this embodiment, for example, as shown in FIGS. 5A to 5D, metal interconnection layers (second, third metal interconnections) 31 formed of an M0 layer of low resistance are independently formed above word lines GC0, GC1 and on the corresponding contacts 16. The metal interconnection layers (second interconnections) 31 above the word lines GC0, GC1 are formed to extend in a first direction in opposition to the respective word lines GC0, GC1. For example, the metal interconnection layers 31 above the word lines GC0, GC1 are connected to the word lines GC0, GC1 via contacts 32 in the end portions of the memory cell array 101. As a result, the resistances of the word lines GC0, GC1 can be reduced.

Further, each of the metal interconnection layers (third metal interconnections) 31 on the respective contacts 16 is connected to one of the bit lines BL0, BL1, BL2 formed of, for example, an M1 layer via a contact (second contact layer) 33 used as C/H2. Thus, the resistances of the bit lines BL0, BL1, BL2 can be reduced. Also, in this case, for example, as shown in FIG. 5D, sufficiently large lithography margins of the contacts 33 can be stably attained by forming redundant dummy contacts (second contact layer) 34 corresponding to the contacts 33 above the dummy contacts 21 with an interlevel film 13 disposed therebetween.

Thus, the memory cell array 101 of this embodiment can be easily realized by separately using the interconnection layers, for example, by using the M0 layer for formation of the metal interconnection layers 31 in order to reduce the resistances of the gate electrodes (word lines GC0, GC1) in a case where the bit lines BL0, BL1, BL2 are formed of the M1 layer, for example. That is, the bit lines BL0, BL1, BL2 may be formed of an M2 layer, for example, in a case where the M1 layer is used for formation of the metal interconnection layers 31, in order to reduce the resistances of the gate electrodes (word lines GC0, GC1).

Third Embodiment

Figure 6A:
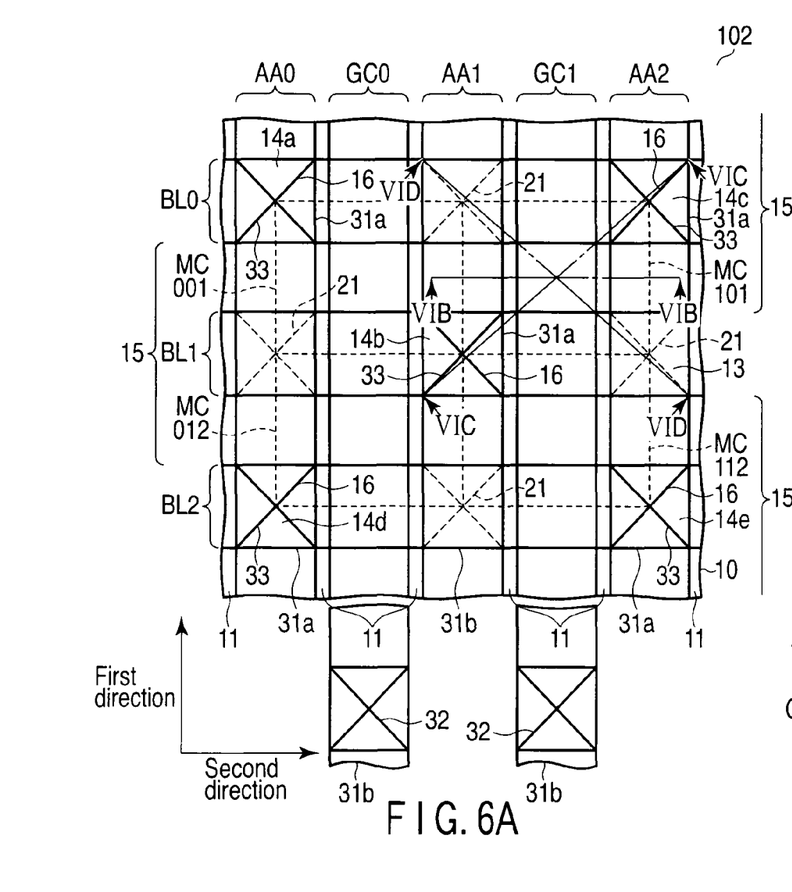
FIGS. 6A to 6D are structural views showing one example of a memory cell array in a NOR flash memory of a MONOS structure according to a third embodiment of this invention.
Figure 6B:
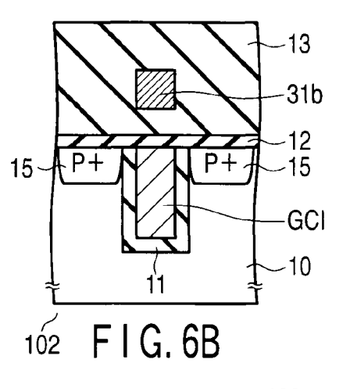
Figure 6C:
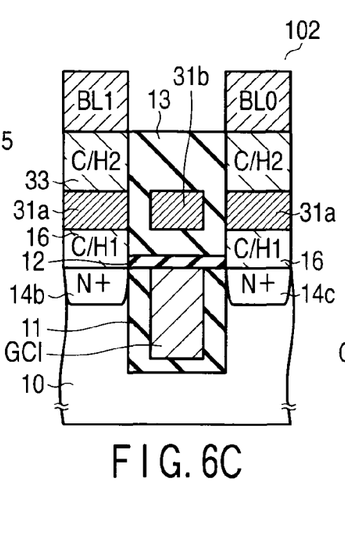
Figure 6D:
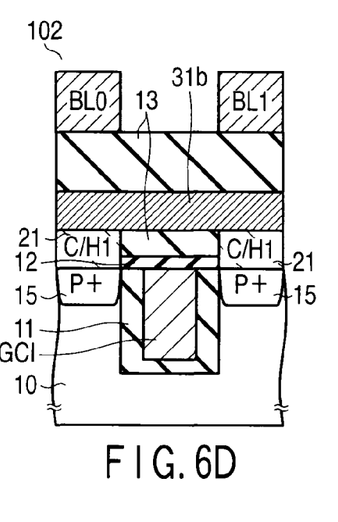

FIGS. 6A to 6D show an example of the structure of a memory cell array 102 in a NOR flash memory of a MONOS structure (nonvolatile semiconductor memory device) according to a third embodiment of this invention. In this example, four memory cells, MC001, MC101, MC012, MC112, which correspond to the portions indicated by the broken lines in FIG. 2, are extracted and shown. FIG. 6A is a plan view obtained by seeing through the internal portion of the memory cell array, FIG. 6B is a cross-sectional view taken along the VIB-VIB line of FIG. 6A, FIG. 6C is a cross-sectional view taken along the VIC-VIC line of FIG. 6A and FIG. 6D is a cross-sectional view taken along the VID-VID line of FIG. 6A. Portions that are the same as those of the second embodiment (FIGS. 5A to 5D) are denoted by the same reference symbols and the detailed explanation thereof is omitted.

This embodiment is an example in which metal interconnection layers (third metal interconnections) 31*a* formed of an M0 layer of low resistance are provided on respective contacts (first contact layers) 16 and metal interconnection layers (second metal interconnections) 31*b* formed of the M0 layer of low resistance are provided to cover portions lying above word lines GC0, GC1 and the upper portions of dummy contacts (first contact layer) 21. For example, the metal interconnection layers 31*a* are independently formed on the respective contacts 16. On the other hand, the metal interconnection layers 31*b* are formed independently from the metal interconnection layers 31*a* and interconnection layers formed to extend in a first direction in opposition to the respective word lines GC0, GC1 are connected to one another via interconnection layers on the respective dummy contacts 21.

That is, in the case of the memory cell array 102, the metal interconnection layers 31*a* on the respective contacts 16 are connected to the contacts 16 and are each connected to one of the bit lines BL0, BL1, BL2 formed of, for example, an M1 layer via a contact (second contact layer) 33.

On the other hand, like the case of the second embodiment, the metal interconnection layers 31*b* lying above the word lines GC0, GC1 and on the dummy contacts 21 are connected to the word lines GC0, GC1 via contacts 32 in the end portions of the memory cell array 102. Further, for example, as shown in FIG. 6D, they are not connected to the bit lines BL0, BL1, BL2 and connected only to P+ diffusion layers 15 in the semiconductor substrate 10 via the dummy contacts 21.

In the case of this embodiment, a substrate potential can be easily obtained by electrically connecting the metal interconnection layers 31*b* to the semiconductor substrate 10. That is, by utilizing the dummy contacts 21 as substrate potential applying contacts, the substrate potentials of the memory cells MC001, MC101, MV012, MC112 can be applied via the metal interconnection layers 31*b*. Therefore, the processibility of the contacts 16 can be enhanced and the resistances of the word lines GC0, GC1 can be reduced. Moreover, the back-gate effect of the cell in the write and read operations can be reduced and a more stable chip operation can be realized.

Particularly, since the substrate potential can be derived at a relatively high frequency in the memory cell array 102, it becomes unnecessary to make a well contact in the array peripheral portion and the area of the array 102 can be reduced accordingly.

In each of the above embodiments, a case wherein the upper surface of the word lines (gate electrodes) is set to substantially the same height of the upper surface of the semiconductor substrate is explained, but this invention is not limited to this case. For example, the upper surface of the word lines can be set higher than the upper surface of the semiconductor substrate to increase the cross-sectional area of the gate electrode so as to lower the resistance.

Further, in each of the above embodiments, a case wherein a NOR flash memory with a MONOS structure is taken as an example is explained, but this invention is not limited to this case. That is, this invention can be similarly applied to a multi-value flash memory (see, for example, ISSCC 2002 "A 512 Mb NROM Flash Data Storage Memory with 8 MB/s Data Rate", Eduardo M., et al., as a NOR multi-value flash memory with a MONOS structure).

In addition, in each of the above embodiments, a case wherein the gate electrodes are formed of polysilicon is explained as an example, but this invention is not limited to this case. For example, a metal material or silicide can be used as a gate electrode material.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
a semiconductor substrate having a plurality of active areas formed to extend in a first direction and separated from one another with a plurality of trench portions disposed therebetween;
a multi-layer insulating film having at least charge storage layers and formed on bottom surfaces and both side surfaces of the plurality of trench portions;
a plurality of gate electrodes filled in internal portions of the plurality of trench portions with the multi-layer insulating film disposed therebetween;
a plurality of first metal interconnections formed to extend in a second direction perpendicular to the first direction, arranged on a surface of the semiconductor substrate with inter-level insulating films disposed therebetween and each functioning as one of bit lines and source lines;
a plurality of first conductivity-type diffusion layer regions arranged in a staggered form in corresponding portions of the plurality of active areas which are formed to intersect with the plurality of first metal interconnections and each functioning as one of sources and drains;
a plurality of second conductivity-type diffusion layer regions having an opposite conductivity type to that of the plurality of first conductivity-type diffusion layer regions and formed in the plurality of active areas to electrically isolate the plurality of first conductivity-type diffusion layer regions from one another; and
a plurality of connection contacts arranged in a staggered form to respectively connect the plurality of first conductivity-type diffusion layer regions to the plurality of first metal interconnections.

2. The nonvolatile semiconductor memory device according to claim 1, further comprising a plurality of second metal interconnections arranged below the plurality of first metal interconnections on the surface of the semiconductor substrate and formed to extend in the first direction in opposition to the plurality of gate electrodes;

wherein the plurality of gate electrodes are electrically connected to at least part of the plurality of second metal interconnections which face the plurality of gate electrodes.

3. The nonvolatile semiconductor memory device according to claim 1, further comprising a plurality of second metal interconnections arranged below the plurality of first metal interconnections on the surface of the semiconductor substrate and formed to extend in the first direction in opposition to the plurality of gate electrodes; a plurality of redundant contacts arranged in portions among corresponding portions of the plurality of active areas which intersect with the plurality of first metal interconnections and in which the plurality of first conductivity-type diffusion layer regions are not arranged; and a plurality of third metal interconnections formed of the same layer as the plurality of second metal interconnections and formed in corresponding portions in which the plurality of first conductivity-type diffusion layer regions are arranged;

wherein the plurality of connection contacts and the plurality of redundant contacts respectively have a first contact layer formed below the plurality of second metal interconnections and the plurality of third metal interconnections and a second contact layer formed above the plurality of second metal interconnections and the plurality of third metal interconnections, the plurality of connection contacts are formed to make one of the plurality of first conductivity-type diffusion layer regions contact with the first contact layer, make the second contact layer contact with one of the plurality of first metal interconnections and electrically connect each of the first and second contact layers to one of the third metal interconnections, and the plurality of redundant contacts are formed to make the second conductivity type diffusion layer region contact with the first contact layer, make the second contact layer contact with one of the plurality of first metal interconnections and electrically isolate the first and second contact layers from each other.

4. The nonvolatile semiconductor memory device according to claim 1, further comprising a plurality of substrate potential applying contacts arranged in portions among corresponding portions of the plurality of active areas which intersect with the plurality of first metal interconnections and in which the plurality of first conductivity-type diffusion layer regions are not arranged; second metal interconnections arranged below the plurality of first metal interconnections on the surface of the semiconductor substrate and formed to extend in the first direction in opposition to the plurality of gate electrodes containing upper portions of the plurality of substrate potential applying contacts; and a plurality of third metal interconnections formed of the same layer as the plurality of second metal interconnections and formed in corresponding portions in which the plurality of first conductivity-type diffusion layer regions are arranged;

wherein the plurality of connection contacts have a first contact layer below the plurality of second metal interconnections and the plurality of third metal interconnections and a second contact layer formed above the plurality of second metal interconnections and the plurality of third metal interconnections, each of the first and second contact layers is electrically connected to one of the third metal interconnections, and the second metal interconnections are electrically connected to the plurality of substrate potential applying contacts and are electrically isolated from the plurality of first metal interconnections.

5. The nonvolatile semiconductor memory device according to claim 1, wherein a channel current flows between those of the plurality of first conductivity-type diffusion layer regions which oppose the plurality of gate electrodes in an oblique direction.

6. The nonvolatile semiconductor memory device according to claim 1, wherein the nonvolatile semiconductor memory device is a NOR flash memory of a metal oxide nitride oxide semiconductor (MONOS) structure.

7. The nonvolatile semiconductor memory device according to claim 6, wherein a write operation is performed with respect to the NOR flash memory of the MONOS structure based on a channel hot electron (CHE) injection system.

8. A control method of the nonvolatile semiconductor memory device described in claim 1, comprising:
applying a first voltage to a first gate electrode among the plurality of gate electrodes which are connected to a selected cell to be written,
applying a ground voltage to a second gate electrode that is adjacent to the first gate electrode and connected to a non-selected cell that is not to be written,
applying a second voltage to one first metal interconnection functioning as a bit line among the plurality of first metal interconnections which are connected to one of the plurality of first conductivity-type diffusion layer regions functioning as a drain of the selected cell, and
applying a ground voltage to another first metal interconnection functioning as a source line among the plurality of first metal interconnections which are connected to one of the plurality of first conductivity-type diffusion layer regions functioning as a source of the selected cell.

9. The control method of the nonvolatile semiconductor memory device according to claim 8, wherein the nonvolatile semiconductor memory device is a NOR flash memory of a metal oxide nitride oxide semiconductor (MONOS) structure.

10. The control method of the nonvolatile semiconductor memory device according to claim 9, wherein a write operation is performed with respect to the NOR flash memory of the MONOS structure based on a channel hot electron (CHE) injection system.

11. A nonvolatile semiconductor memory device comprising:
a semiconductor substrate having a plurality of active areas formed to extend in a first direction;
a multi-layer insulating film having at least charge storage layers and formed on bottom surfaces and both side surfaces of a plurality of trench portions corresponding to portions respectively lying between the plurality of active areas on a surface portion of the semiconductor substrate;
a plurality of gate electrodes filled in internal portions of the plurality of trench portions with the multi-layer insulating film disposed therebetween;
a plurality of first metal interconnections formed to extend in a second direction perpendicular to the first direction, arranged on a surface of the semiconductor substrate with inter-level insulating films disposed therebetween and each functioning as one of bit lines and source lines;
a plurality of first conductivity-type diffusion layer regions arranged in a staggered form in corresponding portions of the plurality of active areas which intersect with the plurality of first metal interconnections and each functioning as one of sources and drains;
a plurality of connection contacts arranged in a staggered form to respectively connect the plurality of first conductivity-type diffusion layer regions to the plurality of first metal interconnections; and a plurality of second metal interconnections arranged below the plurality of first metal interconnections on the surface of the semiconductor substrate and formed to extend in the first direction in opposition to the plurality of gate electrodes;

wherein the plurality of gate electrodes are electrically connected to at least part of the plurality of second metal interconnections which face the plurality of gate electrodes.

12. The nonvolatile semiconductor memory device according to claim 11, wherein a channel current flows between those of the plurality of first conductivity-type diffusion layer regions which oppose the plurality of gate electrodes in an oblique direction.

13. The nonvolatile semiconductor memory device according to claim 11, wherein the nonvolatile semiconductor memory device is a NOR flash memory of a metal oxide nitride oxide semiconductor (MONOS) structure.

14. The nonvolatile semiconductor memory device according to claim 13, wherein a write operation is performed with respect to the NOR flash memory of the MONOS structure based on a channel hot electron (CHE) injection system.

15. A nonvolatile semiconductor memory device comprising:
a semiconductor substrate having a plurality of active areas formed to extend in a first direction;
a multi-layer insulating film having at least charge storage layers and formed on bottom surfaces and both side surfaces of a plurality of trench portions corresponding to portions respectively lying between the plurality of active areas on a surface portion of the semiconductor substrate;
a plurality of gate electrodes filled in internal portions of the plurality of trench portions with the multi-layer insulating film disposed therebetween;
a plurality of first metal interconnections formed to extend in a second direction perpendicular to the first direction, arranged on a surface of the semiconductor substrate with inter-level insulating films disposed therebetween and each functioning as one of bit lines and source lines;
a plurality of first conductivity-type diffusion layer regions arranged in a staggered form in corresponding portions of the plurality of active areas which intersect with the plurality of first metal interconnections and each functioning as one of sources and drains;
a plurality of connection contacts arranged in a staggered form to respectively connect the plurality of first conductivity-type diffusion layer regions to the plurality of first metal interconnections; and
a plurality of second metal interconnections arranged below the plurality of first metal interconnections on the surface of the semiconductor substrate and formed to extend in the first direction in opposition to the plurality of gate electrodes; a plurality of redundant contacts arranged in portions among corresponding portions of the plurality of active areas which intersect with the plurality of first metal interconnections and in which the plurality of first conductivity-type diffusion layer regions are not arranged; and a plurality of third metal interconnections formed of the same layer as the plurality of second metal interconnections and formed in corresponding portions in which the plurality of first conductivity-type diffusion layer regions are arranged;
wherein the plurality of connection contacts and the plurality of redundant contacts respectively have a first contact layer formed below the plurality of second metal interconnections and the plurality of third metal interconnections and a second contact layer formed above the plurality of second metal interconnections and the plurality of third metal interconnections, the plurality of connection contacts are formed to make one of the plurality of first conductivity-type diffusion layer regions contact with the first contact layer, make the second contact layer contact with one of the plurality of first metal interconnections and electrically connect each of the first and second contact layers to one of the third metal interconnections, and the plurality of redundant contacts are formed to make a second conductivity-type diffusion layer region having an opposite conductivity type to that of the plurality of first conductivity-type diffusion layer regions contact with the first contact layer, make the second contact layer contact with one of the plurality of first metal interconnections and electrically isolate the first and second contact layers from each other.

16. The nonvolatile semiconductor memory device according to claim 15, wherein the second conductivity type diffusion layer region has a plurality of regions that are respectively provided in the plurality of active areas and electrically isolate the plurality of first conductivity-type diffusion layer regions from one another.

17. The nonvolatile semiconductor memory device according to claim 15, wherein a channel current flows between those of the plurality of first conductivity-type diffusion layer regions which oppose the plurality of gate electrodes in an oblique direction.

18. The nonvolatile semiconductor memory device according to claim 15, wherein the nonvolatile semiconductor memory device is a NOR flash memory of a metal oxide nitride oxide semiconductor (MONOS) structure.

19. The nonvolatile semiconductor memory device according to claim 18, wherein a write operation is performed with respect to the NOR flash memory of the MONOS structure based on a channel hot electron (CHE) injection system.

20. A nonvolatile semiconductor memory device comprising:
a semiconductor substrate having a plurality of active areas formed to extend in a first direction;
a multi-layer insulating film having at least charge storage layers and formed on bottom surfaces and both side surfaces of a plurality of trench portions corresponding to portions respectively lying between the plurality of active areas on a surface portion of the semiconductor substrate;
a plurality of gate electrodes filled in internal portions of the plurality of trench portions with the multi-layer insulating film disposed therebetween;
a plurality of first metal interconnections formed to extend in a second direction perpendicular to the first direction, arranged on a surface of the semiconductor substrate with inter-level insulating films disposed therebetween and each functioning as one of bit lines and source lines;
a plurality of first conductivity-type diffusion layer regions arranged in a staggered form in corresponding portions of the plurality of active areas which intersect with the plurality of first metal interconnections and each functioning as one of sources and drains;
a plurality of connection contacts arranged in a staggered form to respectively connect the plurality of first conductivity-type diffusion layer regions to the plurality of first metal interconnections; and a plurality of second conductivity-type diffusion layer regions having an opposite conductivity type to that of the plurality of first conductivity-type diffusion layer regions and respectively formed in the plurality of active areas to electrically isolate the plurality of first conductivity-type diffusion layer regions from one another; a plurality of substrate potential applying contacts arranged in portions corresponding to the second conductivity-type diffusion layer regions among corresponding portions of the plurality of active areas that intersect with the plurality of first metal interconnections; second metal interconnections arranged below the plurality of first metal interconnections on the surface of the semiconductor substrate and formed to extend in the first direction in opposition to the plurality of gate electrodes containing upper portions of the plurality of substrate potential applying contacts; and a plurality of third metal interconnections formed of the same layer as the second metal interconnections and formed in corresponding portions in which the plurality of first conductivity-type diffusion layer regions are arranged;

wherein the plurality of connection contacts have a first contact layer formed below the plurality of second metal interconnections and the plurality of third metal interconnections and a second contact layer formed above the plurality of second metal interconnections and the plurality of third metal interconnections, each of the first and second contact layers is electrically connected to one of the third metal interconnections, and the second metal interconnections are electrically connected to the plurality of substrate potential applying contacts and are electrically isolated from the plurality of first metal interconnections.

21. The nonvolatile semiconductor memory device according to claim 20, wherein a channel current flows between those of the plurality of first conductivity-type diffusion layer regions which oppose the plurality of gate electrodes in an oblique direction.

22. The nonvolatile semiconductor memory device according to claim 20, wherein the nonvolatile semiconductor memory device is a NOR flash memory of a metal oxide nitride oxide semiconductor (MONOS) structure.

23. The nonvolatile semiconductor memory device according to claim 22, wherein a write operation is performed with respect to the NOR flash memory of the MONOS structure based on a channel hot electron (CHE) injection system.

* * * * *